United States Patent
Ueda et al.

(10) Patent No.: US 6,733,874 B2
(45) Date of Patent: May 11, 2004

(54) SURFACE-COATED CARBIDE ALLOY CUTTING TOOL

(75) Inventors: Toshiaki Ueda, Naka-gun (JP); Takatoshi Oshika, Naka-gun (JP); Tetsuhiko Honma, Yuuki-gun (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 10/228,963

(22) Filed: Aug. 28, 2002

(65) Prior Publication Data

US 2003/0094085 A1 May 22, 2003

(30) Foreign Application Priority Data

Aug. 31, 2001 (JP) .................... P 2001-264101
Jun. 28, 2002 (JP) .................... P 2002-189604

(51) Int. Cl.$^7$ ................................ B23P 15/28
(52) U.S. Cl. .................... 428/216; 51/307; 51/309; 428/336; 428/698; 428/699; 428/701; 428/702
(58) Field of Search ................... 428/699, 698, 428/701, 702, 216, 336; 51/307, 309

(56) References Cited

U.S. PATENT DOCUMENTS

| | | | |
|---|---|---|---|
| 5,123,934 A | * | 6/1992 | Katayama et al. |
| 5,654,035 A | | 8/1997 | Ljungberg et al. |
| 5,851,687 A | * | 12/1998 | Ljungberg et al. |
| 5,861,210 A | * | 1/1999 | Ienander et al. |
| 6,183,846 B1 | * | 2/2001 | Moriguchi et al. |
| 6,293,739 B1 | * | 9/2001 | Uchino et al. |
| 6,333,098 B1 | * | 12/2001 | Olsson et al. |

FOREIGN PATENT DOCUMENTS

| | | |
|---|---|---|
| EP | 0 403 461 | 12/1990 |
| EP | 0 408 535 A1 | 1/1991 |
| EP | 0 727 510 | 8/1996 |
| JP | 06-008008 | 1/1994 |
| JP | 06-008010 | 1/1994 |
| JP | 07-328808 | 12/1995 |
| JP | 11-138308 | 5/1999 |

* cited by examiner

Primary Examiner—Archene Turner
(74) Attorney, Agent, or Firm—Rader, Fishman & Grauer PLLC (57) ABSTRACT

A cutting tool having a hard coating layer including: a Ti compound layer, as a lower layer, formed by vapor deposition, having an average thickness of 0.5 to 20 μm and made of at least one layer chosen from among a carbide of Ti layer, a nitride of Ti layer, a carbonitride of Ti layer, a carboxide of Ti layer and a carbonitroxide of Ti layer; an aluminum oxide layer, as an intermediate layer, which has an average thickness of 1 to 25 μm and a heat transformed α-type crystal structure derived from a vapor deposited κ- or θ-type aluminum oxide layer, and having a structure having cracks therein formed during heat transformation uniformly dispersed; and an aluminum oxide layer, as an upper layer, formed by vapor deposition having an average thickness of 0.3 to 10 μm and an α-type crystal structure.

7 Claims, 2 Drawing Sheets

SURFACE-COATED CARBIDE ALLOY CUTTING TOOL

BACKGROUND OF THE INVENTION

1. Field of the Invention

The present invention relates to a cutting tool made of a surface-coated cemented carbide alloy (hereinafter referred to as a coated cemented carbide tool) whose cutting edge portion exerts an excellent heat-resistant plastic deformability when various types of steel and cast iron are cut under high-speed cutting conditions accompanied with high heat generation.

2. Description of the Related Art

There has conventionally been known a coated cemented carbide tool comprising, on the surface of a substrate made of a tungsten carbide (hereinafter referred to as WC)-based cemented carbide alloy (hereinafter referred to as a cemented carbide substrate), a hard coating layer composed of the following layers (a) to (c) deposited thereon:

(a) a Ti compound layer, as a lower layer, formed by chemical vapor deposition (hereinafter referred to as "CVD") and/or physical vapor deposition (hereinafter referred to as "PVD") which has an average thickness of 3 to 20 μm and is made of one layer or a plurality of two or more layers among a layer of carbide of Ti (hereinafter referred to as TiC), a layer of nitride of Ti (hereinafter referred to as TiN), a layer of carbonitride of Ti (hereinafter referred to as TiCN), a layer of carboxide of Ti (hereinafter referred to as TiCO) and a layer of carbonitroxide of Ti (hereinafter referred to as TiCNO);

(b) an aluminum oxide (hereinafter referred to as $Al_2O_3$) layer, as an upper layer formed by CVD which has an average thickness of 3 to 15 μm and has an α-type crystal structure; and (c) if necessary, a TiN layer having an average thickness of 0.5 to 2 μm, as a surface layer, is deposited on the upper layer for the purpose of identification of the cutting edges before and after cutting operations because of its golden color tone. Also, it has been known that this coated cemented carbide tool may be used for both continuous and interrupted cutting operations of various types of steel and cast iron.

Also, it has been known that the Ti compound layer and the $Al_2O_3$ layer, which constitute the hard coating layer of the coated cemented carbide tool described above, generally have a granular crystal structure and, as described in Japanese Patent Application, First Publication No. Hei 6-8010, and Japanese Patent Application, First Publication No. Hei 7-328808, the TiCN layer constituting the Ti compound layer is formed by CVD at a moderate temperature within a range from 700 to 950° C. using a mixed gas containing an organic carbonitride as a reaction gas in a conventional CVD apparatus, thereby providing the layer with a crystal structure grown longitudinally for the purpose of improving the toughness of the layer itself.

With recent increases in demands for labor saving and energy saving as well as cost reduction in cutting operations, cutting operations tend to be conducted at high speed, along with the development of high performance cutting machines. When a conventional coated cemented carbide tool is used in continuous cutting or interrupted cutting of various types of steel and cast iron under normal conditions, no problem arise. However, when the coated cemented carbide tool is used in a high-speed cutting operation, thermoplastic deformation, which can cause abnormal wear at the cutting edge portion, is liable to occur due to high heat generated during the cutting operation. As a result, the process of wear is accelerated and failure occurs within a relatively short time.

SUMMARY OF THE INVENTION

From aforementioned point of view, the present inventors have studied about the conventional coated cemented carbide tool in order to develop a coated cemented carbide tool, which exerts an excellent thermoplastic deformation resistance during high-speed cutting operations, thus yielding the following results (1) to (3).

(1) When the Ti compound layer, as a lower layer, is formed on the surface of a cemented carbide substrate under normal deposition conditions and an $Al_2O_3$ layer having a κ- or θ-type crystal structure is formed also under normal deposition conditions and then the resulting material is subjected to a heat treatment in this state, preferably, in an Ar atmosphere under the conditions of a temperature of 1000° C. or higher for a predetermined time, the κ- or θ-type crystal structure is converted into an α-crystal structure. As a result, cracks formed during the heat transformation are uniformly dispersed and distributed in the resulting heat transformed α-type $Al_2O_3$ layer and the heat transformed α-type $Al_2O_3$ layer operates as a heat-insulating layer for high heat generated during high-speed cutting operations due to an action of a large number of cracks which are present in the heat transformed α-type $Al_2O_3$ layer, and also suppresses high heat from being transferred to the cemented carbide substrate. Consequently, thermoplastic deformation of the cutting edge portion is markedly suppressed and the occurrence of abnormal wear is prevented, and therefore the cutting edge portion exhibits a normal wear pattern, thus enabling cutting operations for a long period.

(2) In a coated cemented carbide tool comprising a hard coating layer composed of the heat transformed α-type $Al_2O_3$ layer, as an intermediate layer, and an α-type $Al_2O_3$ layer, as an upper layer, deposited on the surface of the intermediate layer also under normal deposition conditions, some portion of the deposited $Al_2O_3$ sufficiently enters into cracks formed during the heat transformation at the interface with the heat transformed α-type $Al_2O_3$ layer, thereby making it possible to maintain the cracks formed during the heat transformation in a markedly stable state, thus enabling a cutting operation for a long period without causing chipping even if high-speed cutting is conducted under the interrupted conditions.

(3) In the heat transformed α-type $Al_2O_3$ layer formed by heat transformation of the κ-type $Al_2O_3$ layer, since the basal plane of the hexagonal crystal of the respective crystals constituting the layer exhibits a unique orientation, which is generally in parallel with the film growth surface, such that the film itself has excellent wear resistance, the layer exhibits excellent cutting performances, along with the heat-insulating effect of the film.

The present invention has been completed based on the results described above and provides a coated cemented carbide tool, which exerts an excellent thermoplastic deformation resistance during the high-speed cutting operation, the cutting tool comprising, on the surface of a cemented carbide substrate, a hard coating layer including the following layers (a) to (c) or (a) to (d):

(a) a Ti compound layer, as a lower layer, which has an average thickness of 0.5 to 20 μm, preferably 3 to 15 μm, and more preferably 5 to 10 μm, and is made of one layer or a plurality of two or more layers formed by vapor deposition process, among a TiC layer, a TiN layer, a TiCN layer, a TiCO layer and a TiCNO layer;

(b) a heat transformed α-type $Al_2O_3$ layer, as an intermediate layer, which has an average thickness of 1 to 25 μm, preferably 3 to 15 μm, and more preferably 5 to 10 μm, formed by heat transformation of a vapor deposited κ- or θ-type $Al_2O_3$ layer;

(c) an $Al_2O_3$ layer, as an upper layer, formed by vapor deposition process which has an average thickness of 0.3 to 10 μm, preferably 0.5 to 5 μm, and more preferably 0.5 to 2 μm, and an α-type crystal structure; and (d) if necessary, at least one layer of TiN, TiC or TiCN, as a surface layer (d), formed by vapor deposition process which has an average thickness of 0.1 to 5 μm, preferably 0.3 to 4 μm, and more preferably 0.5 to 2 μm.

The $Al_2O_3$ layer having the heat transformed α-type crystal structure preferably has a structure in which cracks formed during the heat transformation are uniformly dispersed and distributed.

The average thickness of each constituent layer of the hard coating layer of the coated cemented carbide tool of the present invention is limited for the following reasons.

(a) Lower Layer (Ti Compound Layer)

The Ti compound layer itself has the toughness (strength) and the hard coating layer is provided with the toughness by the presence of the Ti compound layer, and also strongly adheres to any of the cemented carbide substrate and the heat transformed α-type $Al_2O_3$ as the intermediate layer, thereby to exert an effect of contributing to an improvement in adhesion to the cemented carbide substrate of the hard coating layer. However, when the average thickness is less than 0.5 μm, the effect described above cannot be sufficiently exerted. On the other hand, when the thickness exceeds 20 μm, chipping is liable to occur at the cutting edge portion. Therefore, the average thickness of this layer is preferably within a range from 0.5 to 20 μm.

(b) Intermediate Layer (Heat Transformed α-type $Al_2O_3$ Layer)

As described above, the heat transformed α-type $Al_2O_3$ layer has an effect of preventing high heat generated during high-speed cutting operation due to a function of a large number of cracks, which are uniformly dispersed and distributed in the layer, from being transferring to the cemented carbide substrate, thereby suppressing thermoplastic deformation. However, when the average thickness is less than 1 μm, the effect described above cannot be sufficiently exerted. On the other hand, when the average thickness exceeds 25 μm, cracks formed during the heat transformation, which are present in the intermediate layer, can cause chipping. Therefore, the average thickness of this layer is preferably within a range from 1 to 25 μm.

(c) Upper Layer (α-type $Al_2O_3$ Layer)

The upper layer has a function of sufficiently entering into cracks formed during the heat transformation at the interface with the heat transformed α-type $Al_2O_3$ layer, thereby making it possible to maintain the cracks formed during the heat transformation in a markedly stable state. However, when the average thickness is less than 0.3 μm, the function described above cannot be sufficiently exerted. On the other hand, when the average thickness is up to 10 μm, the function can be sufficiently exerted. Therefore, the average thickness of this layer is preferably within a range from 0.3 to 10 μm.

(d) Surface Layer (At Least One Layer of TiN, TiC or TiCN)

In the case in which the surface layer is formed of TiN, it is optionally formed by vapor deposition process for the purpose of identification of the cutting edges before and after cutting operation because of a golden color tone. However, when the average thickness is less than 0.1 μm, a sufficient identification effect cannot be obtained. On the other hand, when the average thickness is up to 5 μm, the identification effect due to the TiN layer is sufficient. Therefore, the average thickness of this layer is preferably within a range from 0.1 to 5 μm taking into account economic efficiency. Even if a portion or all of the portion excluding the outermost portion of the TiN layer is replaced by the TiC layer and/or the TiCN layer, the above effect is maintained.

It is preferred to provide a Ti oxide layer, which has an average thickness of 0.2 to 5 μm and meets the formula: $TiO_x$ (provided that an atomic ratio x of O to Ti is within a range from 1.2 to 1.9) as measured by an Auger electron spectroscopy at the center portion in the thickness direction, between the upper layer and the surface layer.

The Ti oxide layer has very low affinity for steel and cast iron and also has a characteristic wherein chips produced during cutting are less likely to be smeared, that is, there is surface lubricity. Consequently, abnormal damage caused by smeared chips is markedly suppressed. This effect is particularly exerted when workpieces having a high viscosity made of stainless steel and mild steel are cut.

A ratio of a peak intensity of (006) plane, I(006), to a peak intensity of (113) plane, I(113), is preferably 0.1 or more in an X-ray diffraction profile of the α-type aluminum oxide layer which constitutes the hard coating layer.

A ratio of a peak intensity of (006) plane, I(006), to a peak intensity of (012) plane, I(012), is preferably 0.1 or more in an X-ray diffraction profile of the α-type aluminum oxide layer which constitutes the hard coating layer.

The heat transformed α-type $Al_2O_3$ layer is preferably formed in the following manner. First, in order to stably form a κ- or θ-type crystal structure without including an α-type component, an $Al_2O_3$ layer is formed under the conditions of a temperature of 1000° C. or less, preferably 970° C. or less, and more preferably 950° C. or less. Subsequently, in order to convert the resulting $Al_2O_3$ layer into an α-type crystal structure as completely as possible, the κ- or θ-type crystal structure is subjected to a heat treatment by heating to 1020° C. or higher, preferably 1040° C. or higher, and more preferably 1060° C. or higher, and being allowed to stand for a predetermined time, thereby converting into an α-crystal structure.

DETAILED DESCRIPTION OF THE INVENTION

The coated cemented carbide tool of the present invention will be explained by way of embodiments.

Cemented carbide substrates A to H each having a shape of a insert defined in ISO•CNMG120412 were produced by preparing a WC powder, a TiC powder, a ZrC powder, a TaC powder, a NbC powder, a $Cr_3C_2$ powder, a TiN powder and a Co powder each having a predetermined average grain size of 1 to 5 μm as raw powders, compounding these raw powders according to each formulation shown in Table 1, further adding a wax, mixing them in ethanol in a ball mill for 24 hours, drying the mixture, compacting the dried mixture under a pressure of 150 MPa to form green compacts, vacuum-sintering these green compacts under the conditions of a vacuum degree of 5 Pa and a predetermined temperature within a range from 1370 to 1470° C. for one hour, and subjecting the cutting edge portion to honing (R: 0.07 mm) after it was cooled to room termperature.

After these cemented carbide substrates A to H were subjected to ultrasonic cleaning in acetone and were dried, a Ti compound layer, as a lower layer of a hard coating layer, having a target thickness shown in Table 3 was formed on the surface of these cemented carbide substrates A to H under the conditions (which are the same conditions for formation of a conventional granular crystal structure with the exception of 1-TiCN in Table 2 which shows conditions for formation of a TiCN layer with a crystal structure grown longitudinally as described in Japanese Patent Application, First Publication No. Hei 6-8008) shown in Table 2, using a conventional CVD apparatus, and as an intermediate layer of the hard coating layer, an $Al_2O_3$ layer having a κ- or θ-type crystal structure and a target thickness shown in Table 3 was first formed thereon under the conditions shown in Table 2, and then the κ- or θ-type crystal structure was converted into an α-type crystal structure wherein cracks formed during the heat transformation are uniformly dispersed and distributed in the layer by subjecting it to a subsequent heat treatment in an Ar atmosphere under the conditions of a temperature of 1050° C. for 1 to 8 hours. Furthermore, an α-type $Al_2O_3$ layer having a target thickness shown in Table 3 as an upper layer and, if necessary, a TiOx layer as a lubrication layer and/or a TiN layer as a surface layer were formed thereon under the conditions shown in Table 2, thereby to produce coated cemented carbide tools 1 to 24 of the present invention.

For comparison, as shown in Table 4, conventional coated cemented carbide tools 1 to 24 were respectively produced under the same conditions described above, except that a an as-deposited α-type $Al_2O_3$ layer having an average thickness shown in Table 4 was formed as the upper layer of the hard coating layer and the heat transformed α-type $Al_2O_3$ layer was not formed.

With respect to the coated cemented carbide tools 1 to 24 of the present invention and conventional coated cemented carbide tools 1 to 24 thus obtained, the respective constituent layers of the hard coating layer were observed by using a scanning electron microscope (cross-section of each layer was observed). As a result, it was confirmed that each hard coating layer of any of the former coated cemented carbide tools is composed of a Ti compound layer, a heat transformed α-type $Al_2O_3$ layer wherein cracks formed during the heat transformation are uniformly dispersed and distributed in the layer and a an as-deposited α-type $Al_2O_3$ layer and, if necessary, a TiN layer, while each hard coating layer of any of the latter coated cemented carbide tools is composed of a Ti compound layer and an as-deposited α-type $Al_2O_3$ layer and, if necessary, a TiN layer. Furthermore, the thickness of the respective constituent layers of the hard coating layer of these coated cemented carbide tools was observed also by using a scanning electron microscope. As a result, all of the coated cemented carbide tools exhibited an average thickness (average of five measurements) which is substantially the same as the target thickness.

With respect to the coated cemented carbide tools 1 to 24 of the present invention and conventional coated cemented carbide tools 1 to 24, the crystal structure of these hard coating layers was evaluated by X-ray diffraction. A ratio of a peak intensity of (006) plane whose diffracted intensity accounts for 1% of a maximum peak as defined in ASTM10-173 that describes a standard peak of α-type $Al_2O_3$ against a peak intensity of (113) plane whose diffracted intensity is maximum also as defined in ASTM10-173, I(006)/I(113), was determined. Meanwhile, with respect to the coated cemented carbide tools 2, 7, 9, 14, 21, and 23 of present invention and conventional coated cemented carbide tools 2, 7, 9, 14, 21, and 23, said X-ray diffraction peak ratio could not be calculated, because the diffraction peak of (200) plane of TiC layer significantly interferes the diffraction peak of (006) plane of α-type $Al_2O_3$. The results are shown in Table 5.

Figure 1:
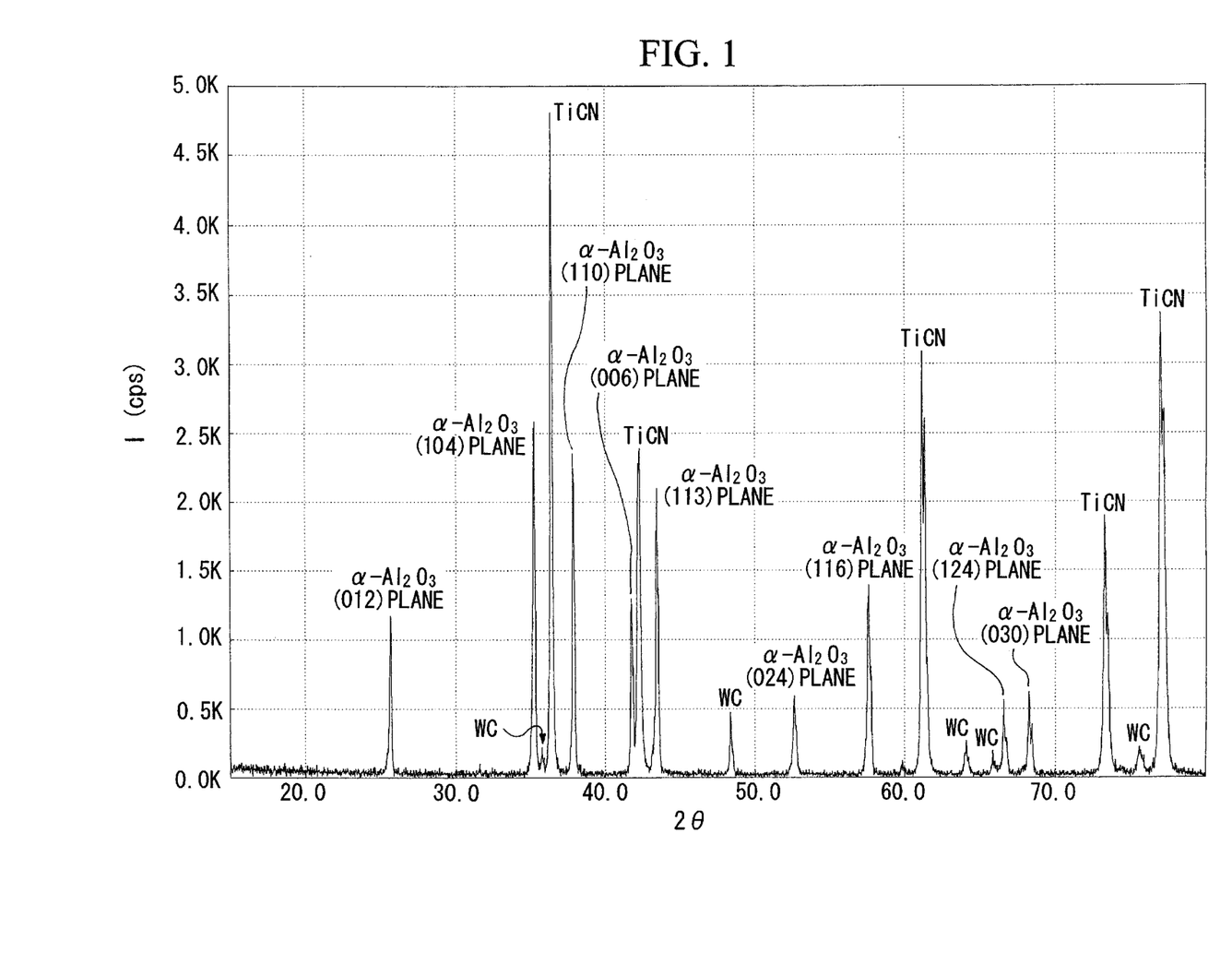
FIG. 1 is an X-ray diffraction chart of the coated cemented carbide tool 17 of the present invention.
Figure 2:
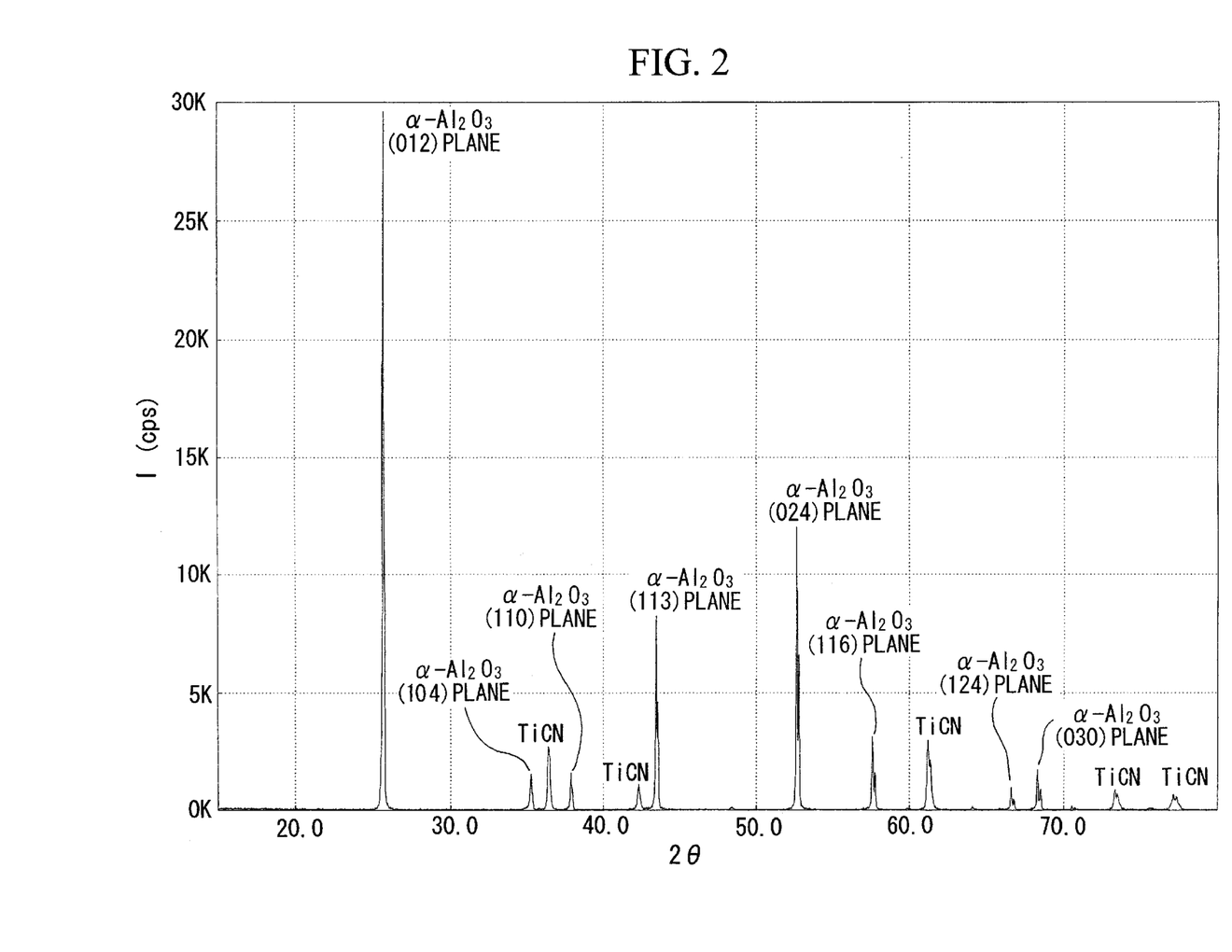
FIG. 2 is an X-ray diffraction chart of the conventional cemented carbide tool 17.

Furthermore, X-ray diffraction charts of the coated cemented carbide tool 17 of the present invention and the conventional cemented carbide tool 17 are respectively shown in FIG. 1 and FIG. 2. With respect to the coated cemented carbide tool 17 of the present invention, the value I(006)/I(113) was 0.67. The cemented carbide tool of the present invention is preferably composed of the $Al_2O_3$ having a value of 0.1 or more. Since κ-type $Al_2O_3$ wherein basal plane of the unit cell of the respective crystals apt to exhibit a characteristic orientation, which is generally in parallel with the film growth surface, was transformed into α-type $Al_2O_3$, said peak ratio becomes 0.1 or more when the thickness is 4 μm or more. Said peak ratio is particularly preferably 0.5 or more.

The coated cemented carbide tools 1 to 24 of the present invention and conventional coated cemented carbide tools 1 to 24 were subjected to a high-speed continuous cutting test of an alloy steel under the following conditions:

Workpiece: JIS•SCM440 round bar,
Cutting speed: 420 m/min.,
Depth of cut: 1.0 mm,
Feed: 0.32 mm/rev.,
Coolant: dry, and
Cutting time: 10 min.;
a high-speed interrupted cutting test of a cast iron under the following conditions:
Workpiece: JIS•FC300 round bar with four longitudinal grooves equally spaced,
Cutting speed: 400 m/min.,
Depth of cut: 0.8 mm,
Feed: 0.35 mm/rev.,
Coolant: dry, and
Cutting time: 5 min.;, and
a high-speed interrupted cutting test of a carbon steel under the following conditions:
Workpiece: JIS•S45C round bar with four longitudinal grooves equally spaced,
Cutting speed: 400 m/min.,
Depth of cut: 0.6 mm,
Feed: 0.2 mm/rev.,
Coolant: dry, and
Cutting time: 5 min.
In all the cutting tests, the flank wear width of the cutting edge was measured. The measurement results are shown in Table 5.

TABLE 1

| Classification | | Composition formula (% by weight) | | | | | | |
|---|---|---|---|---|---|---|---|---|
| | | Co | TiC | ZrC | TaC | NbC | $Cr_3C_2$ | TiN | WC |
| Cemented carbide substrates | A | 6.5 | 2 | — | 4 | 0.5 | — | 1 | balance |
| | B | 11 | 3 | — | 5.5 | — | — | 2 | balance |
| | C | 5 | 1 | — | — | 8 | — | 0.5 | balance |
| | D | 10 | — | — | 2.5 | 0.5 | — | — | balance |
| | E | 7.5 | 1.5 | — | — | 6 | 0.3 | 1.5 | balance |
| | F | 6 | 0.5 | — | — | 0.5 | — | — | balance |
| | G | 12 | 1 | — | — | — | 0.5 | — | balance |
| | H | 8 | — | 3.5 | — | 3 | — | 0.3 | balance |

TABLE 2

| | Forming conditions | | |
|---|---|---|---|
| Classification of constituent layers of hard coating layer | Composition of reactive gas (% by volume) | Reactive atmosphere | |
| | | Pressure (kPa) | Temperature (° C.) |
| TiC | $TiCl_4$: 3%, $CH_4$: 7%, $H_2$: balance | 13 | 1000 |
| TiN (first layer) | $TiCl_4$: 2%, $N_2$: 50%, $H_2$: balance | 13 | 950 |
| TiN (other layers) | $TiCl_4$: 2%, $N_2$: 50%, $H_2$: balance | 25 | 1000 |
| 1-TiCN | $TiCl_4$: 2%, $N_2$: 40%, $CH_3CN$: 0.6%, $H_2$: balance | 7 | 900 |
| TiCN | $TiCl_4$: 4%, $CH_4$: 5%, $N_2$: 20%, $H_2$: balance | 7 | 1000 |
| TiCO | $TiCl_4$: 3%, $CH_4$: 2%, CO: 1.5%, $H_2$: balance | 13 | 1000 |
| TiCNO | $TiCl_4$: 3%, $CH_4$: 2%, $N_2$: 30%, CO: 0.3%, $H_2$: balance | 13 | 1000 |
| $\alpha$-$Al_2O_3$ | $AlCl_3$: 2.2%, $CO_2$: 5.5%, HCl: 2.2%, $H_2S$: 0.2%, $H_2$: balance | 7 | 1000 |
| $\kappa$-$Al_2O_3$ | $AlCl_3$: 3.3%, $CO_2$: 5.5%, HCl: 2.2%, $H_2S$: 0.2%, $H_2$: balance | 7 | 950 |
| $\theta$-$Al_2O_3$ | $AlCl_3$: 4.3%, $CO_2$: 5.5%, HCl: 2.2%, $H_2S$: 0.2%, $H_2$: balance | 7 | 800 |
| $TiO_x$ (1) (x: 1.20) | $TiCl_4$: 0.5%, $CO_2$: 0.2%, Ar: 40%, $H_2$: balance | 30 | 1020 |
| $TiO_x$ (2) (x: 1.50) | $TiCl_4$: 3%, $CO_2$: 10%, Ar: 50%, $H_2$: balance | 14 | 1000 |
| $TiO_x$ (3) (x: 1.90) | $TiCl_4$: 0.2%, $CO_2$: 5%, Ar: 5%, $H_2$: balance | 7 | 900 |

The number in parentheses of $TiO_x$ (1) to $TiO_x$ (3) in the table represents a target value of an atomic ratio x of O to Ti.

TABLE 3

| Classification | | Cemented carbide substrate | Hard coating layer (number in parentheses is target thickness in $\mu$m) | | | | | | |
|---|---|---|---|---|---|---|---|---|---|
| | | | First layer | Second layer | Third layer | Fourth layer | Fifth layer | Sixth layer | Seventh layer |
| Cemented carbide tools of the presnet invention | 1 | A | TiN (0.5) | 1-TiCN (2) | TiCO (0.5) | Heat transformed $\alpha$-type $Al_2O_3$ derived from $\kappa$-type one (2) | Deposited $\alpha$-type $Al_2O_3$ (0.5) | — | — |
| | 2 | B | TiC (5) | TiN (1) | Heat transformed $\alpha$-type $Al_2O_3$ derived from $\theta$-type one (4) | Deposited $\alpha$-type $Al_2O_3$ (2) | TiN (0.5) | — | — |
| | 3 | C | TiCN (1) | 1-TiCN (10) | TiCNO (1) | Heat transformed $\alpha$-type $Al_2O_3$ derived from $\kappa$-type one (1) | Deposited $\alpha$-type $Al_2O_3$ (3) | — | — |
| | 4 | D | TiC (2) | TiN (2) | 1-TiCN (15) | TiCO (1) | heat transformed $\alpha$-type $Al_2O_3$ derived from $\kappa$-type one (5) | deposited $\alpha$-type $Al_2O_3$ (10) | — |
| | 5 | E | TiN (1) | 1-TiCN (4) | TiCN (2) | TiCO (1) | heat transformed $\alpha$-type $Al_2O_3$ derived from $\theta$-type one (3) | deposited $\alpha$-type $Al_2O_3$ (2) | TiN (1) |
| | 6 | F | TiN (1) | TiCO (1) | 1-TiCN (7) | heat transformed $\alpha$-type $Al_2O_3$ | Deposited $\alpha$-type $Al_2O_3$ | TiN (0.5) | — |

TABLE 3-continued

| Classification | Cemented carbide substrate | Hard coating layer (number in parentheses is target thickness in μm) | | | | | | |
|---|---|---|---|---|---|---|---|---|
| | | First layer | Second layer | Third layer | Fourth layer | Fifth layer | Sixth layer | Seventh layer |
| 7 | G | TiC (1) | TiCN (2) | heat transformed α-type Al₂O₃ derived from κ-type one (1) | derived from κ-type one (3) Deposited α-type Al₂O₃ (5) | (4) | — | — |
| 8 | H | TiN (2) | 1-TiCN (15) | TiCNO (0.5) | heat transformed α-type Al₂O₃ derived from κ-type one (1) | Deposited α-type Al₂O₃ (5) | TiN (1) | — |
| 9 | A | TiC (1) | TiCNO (0.5) | heat transformed α-type Al₂O₃ derived from θ-type one (2) | Deposited α-type Al₂O₃ (5) | — | — | — |
| 10 | B | TiN (0.5) | 1-TiCN (5) | TiCN (5) | heat transformed α-type Al₂O₃ derived from θ-type one (3) | Deposited α-type Al₂O₃ (2) | TiN (1) | — |
| 11 | C | TiN (0.5) | 1-TiCN (3) | TiCNO (1) | 1-TiCN (3) | heat transformed α-type Al₂O₃ derived from κ-type one (4) | Deposited α-type Al₂O₃ (3) | TiN (1) |
| 12 | D | TiCN (3) | TiCNO (1) | heat transformed α-type Al₂O₃ derived from κ-type one (2) | Deposited α-type Al₂O₃ (2) | TiN (1) | — | — |
| 13 | E | TiCN (1) | 1-TiCN (9) | heat transformed α-type Al₂O₃ derived from θ-type one (1) | Deposited α-type Al₂O₃ (4) | TiN (2) | — | — |
| 14 | F | TiC (0.5) | 1-TiCN (10) | TiC (3) | TiCNO (1) | heat transformed α-type Al₂O₃ derived from κ-type one (5) | Deposited α-type Al₂O₃ (6) | TiN (0.5) |
| 15 | G | TiN (1) | 1-TiCN (8) | TiCO (1) | heat transformed α-type Al₂O₃ derived from θ-type one (3) | Deposited α-type Al₂O₃ (5) | TiN (1) | — |
| 16 | H | TiCN (5) | heat transformed α-type Al₂O₃ derived from κ-type one (5) | Deposited α-type Al₂O₃ (10) | TiN (2) | — | — | — |
| 17 | A | TiN (0.5) | 1-TiCN (10) | TiCNO (0.5) | heat transformed α-type Al₂O₃ derived from κ-type one (10) | Deposited α-type Al₂O₃ (5) | — | — |
| 18 | B | TiCN (2) | 1-TiCN (5) | TiN (1) | heat transformed α-type Al₂O₃ derived from κ-type one (12) | Deposited α-type Al₂O₃ (1) | TiN (0.5) | — |
| 19 | C | TiC (2) | TiCN (5) | heat transformed α-type Al₂O₃ derived from κ-type one (8) | Deposited κ-type Al₂O₃ (3) | — | — | — |
| 20 | D | TiN (2) | heat transformed α-type Al₂O₃ derived from θ-type one (2.5) | Deposited κ-type Al₂O₃ (2) | TiO_x (1) (0.8) | TiN (0.8) | — | — |

TABLE 3-continued

| Classification | Cemented carbide substrate | Hard coating layer (number in parentheses is target thickness in μm) | | | | | |
|---|---|---|---|---|---|---|---|
| | | First layer | Second layer | Third layer | Fourth layer | Fifth layer | Sixth layer | Seventh layer |
| 21 | E | TiCN (2) | 1-TiCN (5) | TiC (3) | heat transformed α-type Al₂O₃ derived from κ-type one (3) | Deposited α-type Al₂O₃ (1) | TiO$_x$(2) (0.8) | TiN (0.5) |
| 22 | F | TiC (2) | TiCO (1) | 1-TiCN (8) | TiC (0.3) | heat transformed α-type Al₂O₃ derived from θ-type one (17) | Deposited α-type Al₂O₃ (3) | TiN (0.5) |
| 23 | G | TiC (2) | TiCNO (0.5) | heat transformed α-type Al₂O₃ derived from κ-type one (2) | Deposited α-type Al₂O₃ (1) | — | — | — |
| 24 | H | TiCN (0.5) | heat transformed α-type Al₂O₃ derived from κ-type one (15) | Deposited α-type Al₂O₃ (5) | TiO$_x$(3) (0.8) | TiN (0.2) | — | — |

TABLE 4

| Classification | | Cemented carbide substrate | Hard coating layer (number in parentheses is target thickness in μm) | | | | | |
|---|---|---|---|---|---|---|---|---|
| | | | First layer | Second layer | Third layer | Fourth layer | Fifth layer | Sixth layer |
| Conventional Cemented carbide tools | 1 | A | TiN (0.5) | 1-TiCN (2) | TiCO (0.5) | Deposited α-type Al₂O₃ (2.5) | — | — |
| | 2 | B | TiC (5) | TiN (1) | Deposited α-type Al₂O₃ (6) | TiN (0.5) | — | — |
| | 3 | C | TiCN (1) | 1-TiCN (10) | TiCNO (1) | Deposited α-type Al₂O₃ (4) | — | — |
| | 4 | D | TiC (2) | TiN (2) | 1-TiCN (15) | TiCO (1) | Deposited α-type Al₂O₃ (15) | — |
| | 5 | E | TiN (1) | 1-TiCN (4) | TiCN (2) | TiCO (1) | Deposited α-type Al₂O₃ (5) | TiN (1) |
| | 6 | F | TiN (1) | TiCO (1) | 1-TiCN (7) | Deposited α-type Al₂O₃ (7) | TiN (0.5) | — |
| | 7 | G | TiC (1) | TiCN (2) | Deposited α-type Al₂O₃ (6) | — | — | — |
| | 8 | H | TiN (2) | 1-TiCN (15) | TiCNO (0.5) | Deposited α-type Al₂O₃ (6) | TiN (1) | — |
| | 9 | A | TiC (1) | TiCNO (0.5) | Deposited α-type Al₂O₃ (7) | — | — | — |
| | 10 | B | TiN (0.5) | 1-TiCN (5) | TiCN (5) | Deposited α-type Al₂O₃ (5) | TiN (1) | — |
| | 11 | C | TiN (0.5) | 1-TiCN (3) | TiCNO (1) | 1-TiCN (3) | Deposited α-type Al₂O₃ (7) | TiN (1) |

TABLE 4-continued

| Classification | Cemented carbide substrate | Hard coating layer (number in parentheses is target thickness in μm) | | | | | |
|---|---|---|---|---|---|---|---|
| | | First layer | Second layer | Third layer | Fourth layer | Fifth layer | Sixth layer |
| 12 | D | TiCN (3) | TiCNO (1) | Deposited α-type $Al_2O_3$ (4) | TiN (1) | — | — |
| 13 | E | TiCN (1) | 1-TiCN (9) | Deposited α-type $Al_2O_3$ (5) | TiN (2) | — | — |
| 14 | F | TiC (0.5) | 1-TiCN (10) | TiC (3) | TiCNO (1) | Deposited α-type $Al_2O_3$ (11) | TiN (0.5) |
| 15 | G | TiN (1) | 1-TiCN (8) | TiCO (1) | Deposited α-type $Al_2O_3$ (8) | TiN (1) | — |
| 16 | H | TiCN (5) | Deposited α-type $Al_2O_3$ (15) | TiN (2) | — | — | — |
| 17 | A | TiN (0.5) | 1-TiCN (10) | TiCNO (0.5) | Deposited α-type $Al_2O_3$ (12) | — | — |
| 18 | B | TiCN (2) | 1-TiCN (5) | TiN (1) | Deposited α-type $Al_2O_3$ (13) | TiN (0.5) | — |
| 19 | C | TiC (2) | TiCN (5) | Deposited α-type $Al_2O_3$ (11) | — | — | — |
| 20 | D | TiN (2) | Deposited α-type $Al_2O_3$ (4.5) | $TiO_x$(1) (0.8) | TiN (0.8) | — | — |
| 21 | E | TiCN (2) | 1-TiCN (5) | TiC (3) | Deposited α-type $Al_2O_3$ (26) | $TiO_x$(2) (0.8) | TiN (0.5) |
| 22 | F | TiC (2) | TiCO (1) | 1-TiCN (8) | TiCO (0.3) | Deposited α-type $Al_2O_3$ (20) | TiN (0.5) |
| 23 | G | TiC (2) | TiCNO (0.5) | Deposited α-type $Al_2O_3$ (3) | — | — | — |
| 24 | H | TiCN (0.5) | Deposited α-type $Al_2O_3$ (20) | $TiO_x$(3) (0.8) | TiN (0.2) | — | — |

TABLE 5

| Classification | | I(006)/I(113) | Flank wear width (mm) | | | Classification | | I(006)/I(113) | Flank wear width (mm) | | |
|---|---|---|---|---|---|---|---|---|---|---|---|
| | | | Alloy steel | Carbon steel | Cast iron | | | | Alloy steel | Carbon steel | Cast iron |
| Coated Cemented Carbide Tools of the Present invention | 1 | 0.06 | 0.22 | 0.21 | 0.36 | Conventional coated Cemented carbide tools | 1 | 0 | 1.31 | 1.35 | 1.40 |
| | 2 | — | 0.41 | 0.39 | 0.44 | | 2 | — | 1.50 | 1.44 | 1.63 |
| | 3 | 0.02 | 0.21 | 0.24 | 0.35 | | 3 | 0 | 1.30 | 1.36 | 1.41 |
| | 4 | 0.25 | 0.43 | 0.42 | 0.64 | | 4 | 0 | 1.35 | 1.45 | 1.70 |
| | 5 | 0.06 | 0.33 | 0.37 | 0.46 | | 5 | 0 | 1.51 | 1.52 | 1.68 |
| | 6 | 0.14 | 0.29 | 0.28 | 0.43 | | 6 | 0 | 1.32 | 1.39 | 1.45 |
| | 7 | — | 0.48 | 0.45 | 0.55 | | 7 | — | 1.70 | 1.72 | 1.77 |
| | 8 | 0.02 | 0.35 | 0.33 | 0.48 | | 8 | 0 | 1.60 | 1.59 | 1.60 |
| | 9 | — | 0.28 | 0.30 | 0.45 | | 9 | — | 1.35 | 1.45 | 1.58 |
| | 10 | 0.03 | 0.40 | 0.38 | 0.52 | | 10 | 0 | 1.51 | 1.43 | 1.77 |
| | 11 | 0.17 | 0.23 | 0.25 | 0.38 | | 11 | 0 | 1.38 | 1.33 | 1.57 |
| | 12 | 0.06 | 0.50 | 0.51 | 0.60 | | 12 | 0 | 1.73 | 1.72 | 1.75 |

TABLE 5-continued

| | Flank wear width (mm) | | | | | Flank wear width (mm) | | | |
|---|---|---|---|---|---|---|---|---|---|
| Classification | I(006)/ I(113) | Alloy steel | Carbon steel | Cast iron | Classification | I(006)/ I(113) | Alloy steel | Carbon steel | Cast iron |
| 13 | 0.02 | 0.32 | 0.35 | 0.45 | 13 | 0 | 1.32 | 1.35 | 1.78 |
| 14 | — | 0.30 | 0.32 | 0.40 | 14 | — | 1.34 | 1.37 | 1.75 |
| 15 | 0.14 | 0.48 | 0.49 | 0.66 | 15 | 0 | 1.68 | 1.65 | 1.77 |
| 16 | 0.33 | 0.36 | 0.38 | 0.50 | 16 | 0 | 1.53 | 1.52 | 1.78 |
| 17 | 0.67 | 0.23 | 0.24 | 0.34 | 17 | 0 | 1.13 | 1.30 | 1.45 |
| 18 | 0.97 | 0.19 | 0.24 | 0.32 | 18 | 0 | 1.52 | 1.44 | 1.52 |
| 19 | 0.61 | 0.24 | 0.26 | 0.31 | 19 | 0 | 1.48 | 1.41 | 1.49 |
| 20 | 0.12 | 0.30 | 0.30 | 0.32 | 20 | 0 | 1.55 | 1.42 | 1.46 |
| 21 | — | 0.18 | 0.18 | 0.20 | 21 | — | 1.32 | 1.40 | 1.11 |
| 22 | 0.32 | 0.30 | 0.29 | 0.26 | 22 | 0 | 1.30 | 1.38 | 1.25 |
| 23 | — | 0.33 | 0.29 | 0.24 | 23 | — | 1.28 | 1.31 | 1.30 |
| 24 | 1.33 | 0.21 | 0.24 | 0.32 | 24 | 0 | 1.40 | 1.29 | 1.22 |

As is apparent from the results shown in Tables 3 to 5, all coated cemented carbide tools 1 to 24 of the present invention exhibit excellent wear resistance because the cutting edge portion has an excellent thermoplastic deformation resistance due to the action of cracks formed during the thermal transformation which are uniformly dispersed and distributed in a heat transformed a-type $Al_2O_3$ layer constituting an intermediate layer of a hard coating layer even in a high-speed interrupted cutting test and a high-speed continuous cutting test of steel and cast iron accompanied with very high heat generation and, therefore, the cutting edge portion exhibits a normal wear pattern. In the conventional coated cemented carbide tools 1 to 24 wherein the heat transformed a-type $Al_2O_3$ layer is not formed in the hard coating layer, thermoplastic deformation, which can cause abnormal wear at the cutting edge portion, occurred in the high-speed cutting test, thereby accelerating the advance of wear.

As described above, the coated cemented carbide tool of the present invention exhibits excellent wear resistance for a long period when used in high-speed cutting operations accompanied with high heat generation, not to mention the continuous or interrupted cutting operation of various types of steel and cast iron under normal conditions. Therefore, the coated cemented carbide tool can sufficiently cope with the development of high performance cutting machines to a satisfactory degree, and enables further labor saving and energy saving as well as cost reduction in cutting operations.

What is claimed is:

1. A surface-coated cemented carbide alloy cutting tool comprising a hard coating layer and a cemented carbide alloy substrate, the hard coating layer comprising:
   a Ti compound layer, as a lower layer, formed by vapor deposition, having, an average thickness of 0.5 to 20 μm, said Ti compound layer comprising at least one layer selected from the group consisting of a layer of a carbide of Ti, a layer of a nitride of Ti, a layer of a carbonitride of Ti, a layer of a carboxide of Ti, and a layer of a carbonitroxide of Ti;
   a first aluminum oxide layer, as an intermediate layer, having an average thickness of 1 to 25 μm, said first aluminum oxide layer having a heat transformed α-type crystal structure derived from a vapor deposited κ- or θ-type aluminum oxide layer; and
   a second aluminum oxide layer, as an upper layer, formed by vapor deposition, having an average thickness of 0.3 to 10 μm, said second aluminum oxide layer having an α-type crystal structure.

2. A surface-coated cemented carbide alloy cutting tool according to claim 1, wherein the hard coating layer further comprises at least one layer of titanium nitride, titanium carbide or titanium carbonitride as a surface layer formed as the uppermost layer, said layer(s) of titanium nitride, titanium carbide or titanium carbonitride having an average thickness of 0.1 to 5 μm.

3. A surface-coated cemented carbide alloy cutting tool according to claim 2, further comprising a Ti oxide layer having an average thickness of 0.2 to 5 μm and being represented by the formula: TiOx, wherein the atomic ratio x of O to Ti is within a range from 1.2 to 1.9, as measured by an Auger electron spectroscopy at the center portion in the thickness direction, said Ti oxide layer being located between said upper layer and said surface layer.

4. A surface-coated cemented carbide alloy cutting tool according to any one of claims 1 to 3, wherein said heat transformed α-type first aluminum oxide layer of said hard coating layer has an X-ray diffraction peak ratio of 0.1 or more, said X-ray diffraction peak ratio being a ratio of a peak intensity of a (006) plane, I(006), to a peak intensity of a (113) plane, I(113).

5. A surface-coated cemented carbide alloy cutting tool according to claim 4, wherein said heat transformed α-type first aluminum oxide layer of said hard coating layer has an X-ray diffraction peak ratio of 0.1 or more, said X-ray diffraction peak ratio being a ratio of a peak intensity of a (006) plane, I(006), to a peak intensity of a (012) plane, I(012).

6. A surface-coated cemented carbide alloy cutting tool according to claim 1, wherein said first aluminum oxide layer having said heat transformed α-type crystal structure, has cracks therein formed during said heat transformation of said κ- or θ-type aluminum oxide layer to said α-type first aluminum oxide layer.

7. A surface-coated cemented carbide alloy cutting tool according to claim 1, wherein said first aluminum oxide layer having said heat transformed α-type crystal structure, has cracks therein formed during said heat transformation of said κ- or θ-type aluminum oxide layer to said α-type first aluminum oxide layer, said cracks being uniformly dispersed in said first aluminum oxide layer.

* * * * *